United States Patent

Saijo et al.

[11] Patent Number: 5,204,167
[45] Date of Patent: Apr. 20, 1993

[54] DIAMOND-COATED SINTERED BODY EXCELLENT IN ADHESION AND PROCESS FOR PREPARING THE SAME

[75] Inventors: Kosuke Saijo; Masaru Yagi; Kunio Shibuki; Takeshi Sadahiro, all of Kawasaki; Mika Niwa, Yokohama, all of Japan

[73] Assignee: Toshiba Tungaloy Co., Ltd., Kawasaki, Japan

[21] Appl. No.: 798,972

[22] Filed: Nov. 29, 1991

Related U.S. Application Data

[63] Continuation of Ser. No. 458,521, Dec. 28, 1989, abandoned.

[30] Foreign Application Priority Data

Feb. 23, 1989 [JP] Japan .................................. 1-44891
Apr. 21, 1989 [JP] Japan ................................. 1-102168
Apr. 28, 1989 [JP] Japan ................................. 1-110992

[51] Int. Cl.⁵ ..................... C04B 41/06; C23C 11/00
[52] U.S. Cl. .................................. 428/212; 428/408; 428/457; 428/697; 428/698; 428/699
[58] Field of Search ............. 428/408, 698, 697, 699, 428/336, 212, 457

[56] References Cited

U.S. PATENT DOCUMENTS

| | | | |
|---|---|---|---|
| 3,755,866 | 9/1973 | Ohlsson | 29/95 |
| 4,194,790 | 3/1980 | Kenny et al. | 51/309 |
| 4,359,335 | 11/1982 | Garner | 76/DIG. 11 |
| 4,488,882 | 12/1984 | Dausinger et al. | 51/309 |
| 4,642,003 | 2/1987 | Yoshimura | 407/119 |
| 4,698,266 | 10/1987 | Buljan et al. | 428/698 |
| 4,705,124 | 11/1987 | Abrahamson et al. | 76/DIG. 11 |
| 4,707,384 | 11/1987 | Schachner et al. | 428/408 |
| 4,731,296 | 3/1988 | Kikuchi et al. | 428/408 |
| 4,748,515 | 5/1988 | Fischer et al. | 428/336 |
| 4,828,612 | 5/1989 | Yohe | 75/238 |
| 4,900,628 | 2/1990 | Ikega et al. | 428/408 |

FOREIGN PATENT DOCUMENTS

| | | |
|---|---|---|
| 0327110 | 8/1989 | European Pat. Off. |
| 133688 | 1/1979 | Fed. Rep. of Germany |
| 148349 | 5/1981 | Fed. Rep. of Germany |
| 0083517 | 6/1980 | Japan |
| 61-52541 | 11/1981 | Japan |
| 1124573 | 6/1986 | Japan |
| 2196371 | 8/1987 | Japan |
| 0274771 | 11/1988 | Japan |
| 2095702 | 8/1982 | United Kingdom |

Primary Examiner—Ellis P. Robinson
Assistant Examiner—A. Turner
Attorney, Agent, or Firm—Foley & Lardner

[57] ABSTRACT

There are disclosed a diamond-coated sintered body, comprising a film of diamond and/or diamond-like carbon deposited on the surface of a sintered body of a hard phase composed mainly of a mixture of $W_2C$ and WC and inevitable impurities and a process for preparing the same.

8 Claims, No Drawings

DIAMOND-COATED SINTERED BODY EXCELLENT IN ADHESION AND PROCESS FOR PREPARING THE SAME

This application is a continuation, of application Ser. No. 07/458,521, filed Dec. 28, 1989 now abandoned.

BACKGROUND OF THE INVENTION

This invention relates to a diamond-coated sintered body excellent in adhesion strength comprising a film of diamond or diamond-like carbon deposited on the surface of a substrate of a ceramics sintered body composed mainly of tungsten carbide and a process for preparing the same. More specifically, it relates to a diamond-coated sintered body excellent in adhesion strength which is suitable as the material for parts to be used in electrical industries, electronic industries, precise instrument industries, office instrument industries, etc. primarily for, for example, material for cutting tool, material for abrasion resisting tool or materials for decoration, and a process for preparing the same.

Investigations have been made in the prior art about practical application of a diamond coated sintered body having film of diamond and/or diamond-like carbon deposited on the surface of a substrate comprising a sintered body of a metal, an alloy or ceramics. Such diamond-coated sintered body, because diamond is inferior in chemical bonding with other substances, involves the problem as the greatest task how the film of diamond and/or diamond-like carbon can be coated on the surface of the substrate under the state enhanced in adhesion. Particularly, in the case of materials for cutting tool, milling tools, drills and end mills, since they are used under the severest conditions, adhesion strength between the film and the substrate will become further important problem.

There have been a large number of proposals about use of diamond-coated sintered bodies which are enhanced in adhesion strength between the film of diamond and the substrate and can be used as the material for cutting tools, and they have comprised the representative examples which have made investigations from the aspect of the material of the substrate, wherein Japanese Provisional Patent Publications No. 126972/1983, No. 57802/1987, No. 166904/1987 and No. 99102/1988, and as a representative example which has made investigation from the aspect of the work strain on the surface of the substrate, there is Japanese Patent Publication No. 4586/1989.

Japanese Provisional Patent Publication No. 126972/1983 discloses a cemented carbide tool comprising at least one selected from carbides, nitrides, borides and oxides of the groups 4a, 5a and 6a elements and their compounds, mixtures thereof, or $Al_2O_3$, AlN, $B_4C$, SiC, $Si_3N_4$, $SiO_2$, as inner layer adjacent to the surface of a cemented carbide, and comprising diamond as outer layer. In this time, cemented carbide as the substrate comprises at least one carbide and nitride. The invention according to this Japanese Provisional Patent Publication No. 126972/1983 attempts to solve the problem that diamond is transformed to graphite when a diamond is coated directly on a cemented carbide containing Co or Ni, by interposing an intermediate layer containing no metal such as Fe, Co and Ni, for example, tungsten carbide between the cemented carbide and the diamond film. However, although there is no great problem with respect to the adhesion strength between the intermediate layer formed by the chemical vapor deposition method (CVD method) or the physical vapor deposition method (PVD method) and the substrate, but adhesion strength between the diamond film and the intermediate film is inferior to make practical application impossible. Also, the invention disclosed in the same Publication involves the problem of cumbersomeness of the process that the diamond film is required to be formed in an entirely separate reaction vessel after coating of the intermediate layer by the CVD method or the PVD method in order to form a diamond film with good quality. Also, as concerned with such cumbersomeness of the process, it has a problem that impurities are readily attached at the interface between the intermediate layer and the diamond film, whereby the adhesion strength of the diamond film, is lowered.

Japanese Provisional Patent Publication No. 57802/1987 discloses a hard carbon coated part, comprising a compound thin film of W and C composed mainly of $W_2C$ with a thickness of 0.1 μm or more interposed between the hard carbon thin film and the substrate. The invention according to the same Publication has accomplished the improvement of adhesion strength as the result of formation of a diffusion layer generating WC at the interface between hard carbon and $W_2C$ when the intermediate layer as described above is coated on the surface of a substrate comprising a cemented carbide or ceramics, and subsequently hard carbon is coated on the surface of an intermediate layer, but it has the problem of cumbersomeness of the process that the hard carbon film is required to be formed in an entirely separate reaction vessel after formation of the intermediate layer by the CVD method or the PVD method, and there is also a problem that adhesion strength between the intermediate layer and the hard carbon thin film is inferior because impurities are readily attached on the intermediate surface.

Japanese Provisional Patent Publication No. 166904/1987 discloses a hard carbon film coated cutting tool for working of ceramics materials, comprising a substrate of a ceramics sintered body composed mainly of silicon nitride, silicon carbide, zirconium oxide, aluminum oxide, and a thin film of hard carbon coated to 0.5 to 50 μm under low pressure on the surface thereof. The invention in the same Publication enables the cutting of a fine ceramics which is a difficultly cuttable material by use of a ceramics with high deformation resistance as the substrate and coating a thin film of hard carbon on the surface thereof, but, for example, there is a problem that adhesion strength between the substrate and the thin film deteriorates as the content of diamond in the hard carbon is increased, while abrasion resistance is lowered, if on the contrary, the content of diamond is decreased.

Japanese Provisional Patent Publication No. 53269/1988 discloses a diamond-coated chip in cutting tool comprising a substrate of cemented carbide containing 1 to 4% by weight of Co and the balance of tungsten carbide in this substrate having a structure with a grain size of 2 to 10 μm. The invention in Japanese Provisional Patent Publication No. 53269/1988, as different from those having the intermediate layer of WC or $W_2C$ between the diamond film or hard carbon film and the substrate in Japanese Provisional Patent Publications No. 126972/1983 and No. 57802/1987 as described above, comprises a diamond film deposited on the surface of the etching layer formed by etching Co existing on the surface of a cemented carbide by the acid treatment, and is free from the problem of cumbersomeness in the process and the deterioration of adhesion strength between the etching layer and the substrate. However, there are involved the problems that if the thickness of the etching layer becomes thick, the portion of Co removed by etching may sometimes remain as a void, whereby adhesion strength between the diamond film and the etching layer may be extremely lowered. To the contrary, if the thickness of the etching layer becomes thin, the generation of graphite during diamond deposition cannot be prevented enough.

Japanese Provisional Patent Publication No. 99102/1988 discloses a diamond coated tungsten tool, comprising tungsten as the substrate and diamond film coated to 1 to 100 μm on said substrate. This invention in the same Publication has solved the problem of adhesion strength by use of tungsten as the substrate, in view of the diamond-coated tool of the prior art comprising a diamond thin film coated on the substrate surface of a cemented carbide or ceramics having the problem in adhesion strength between the thin film and the substrate. However, since tungsten itself is soft and hence susceptible to plastic deformation, whereby there is the problem that its life is short when used as the cutting tool.

Japanese Patent Publication No. 4586/1989 discloses a method in which the working strain is generated on the surface of cemented carbide by grinding with a grinding wheel for deposition of diamond, the respective work strain before and after grinding are determined as a half value widths of the X-ray diffraction line at the WC (100) crystal face, and subsequently, diamond film is coated on the surface of the substrate with its certain ratio. The invention in the same Publication resides in remarkable increase of the crystal nucleus of diamond by depositing a diamond on the substrate surface having a certain amount of work strain, whereby the film with fine structure is formed and also the adhesion strength between the film and the substrate is excellent. However, since VIII group metal in the periodic table is contained in the cemented carbide of the substrate, there are problems such that graphite is readily formed on the surface of the substrate at the initial stage during diamond deposition.

SUMMARY OF THE INVENTION

The present invention has solved the problems as described above, and specifically aims at providing a diamond-coated sintered body which is excellent in adhesion strength between the substrate and the diamond and/or diamond-like carbon film, and also practically applicable as the materials for the cutting tool, and a process for preparing the same.

The present inventors have investigated about the surface state morphology of the substrate before and after diamond deposition in the case of depositing diamond film on the surface of a sintered body mainly composed of tungsten carbide, for example, cemented carbide, and consequently obtained firstly a knowledge, even when diamond film is deposited on the surface which is etched Co metal existing in the surface part of the substrate by etching treatment, deposition of a minute amount of graphite can be seen at the interface between the film and the substrate, although deposition of graphite at the initial stage of diamond deposition is inhibited. Secondly, there has been also obtained a knowledge that when oxygen gas is permitted to flow into the system before deposition of diamond for inhibiting completely generation of graphite according to the first knowledge, decarburization and removal of metal such as Co, etc. occur in the surface layer of the substrate, and when deposition of diamond is subsequently performed, the surface layer of the substrate will become the surface layer comprising recrystallized tungsten carbide, and the diamond film formed on the surface of the surface layer is excellent in adhesion and adhesion strength.

More specifically, the diamond-coated sintered body excellent in adhesion strength of the present invention wherein the surface layer to at most 10 μm toward the inner portion from a surface of said substrate comprises recrystallized tungsten carbide, when diamond film and/or diamond like carbon formed on the surfac eof said substrate, and the average grain size of the recrystallized tungsten carbide in the surface layer is finer as compared with that existing in the inner portion excluding the said surface layer.

The present inventors have also investigated about the kind of substrate, the thickness of the film and adhesion strength between the film and the substrate under the deposition conditions of diamond. In case of depositing diamond film on the surface of a substrate comprising a sintered body mainly composed of tungsten carbide compared with another kinds of substrate, for example, cemented carbide or a cermet containing VIII group metal in periodic table, generation of graphite at the initial stage of diamond deposition can be inhibited, and also by performing decarburization treatment into said substrate before diamond deposition, and subsequently deposition of diamond adhesion strength becomes further stronger, and consequently it is able to make a product practically available as material for cutting tools.

More specifically, the diamond-coated sintered body excellent in adhesion comprises a film of diamond and/or diamond-like carbon formed on the surface of a substrate of a sintered body comprising a hard phase composed mainly of tungsten carbide and inevitable impurities.

The present inventors have further obtained knowledges that in a diamond-coated sintered body having a diamond film on the surface of a substrate comprising the hard phase composed mainly of tungsten carbide, adhesion strength between the film and the substrate differs depending on the amount of the strain existing on the surface of the substrate before deposition of the diamond and the deposition conditions of the film, and also that the adhesion strength is correlated with the half-value width of the X-ray diffraction line at the WC (100) face obtained by measurement with the Cr-Kα line from the surface of the film of the diamond sintered body.

More specifically, the diamond-coated sintered body excellent in adhesion strength of the present invention comprises a diamond film and/or diamond-like carbon film deposited on the surface of a substrate of a sintered body comprising a hard phase composed mainly of tungsten carbide and inevitable impurities, wherein said diamond-coated sintered body has a half value width of X-ray diffraction line at the WC (100) face with the Cr-Kα line from the surface of said coated film is 0.2° to 0.4° in terms of $2\theta$.

DESCRIPTION OF THE PREFERRED EMBODIMENTS

The substrate in the diamond-coated sintered body excellent in adhesion strength of the present invention may be a substrate such that, when diamond is deposited on the surface layer of the substrate which is decarburized the surface layer may mainly compose of tungsten carbide. Specifically sintered bodies comprising tungsten carbide and inevitable impurities, or sintered bodies comprising at least 50% by volume of tungsten carbide, with the balance comprising at least one of carbides, nitrides of metals of the groups 4a, 5a and 6a (such as Ti, Zr, Hf, V, Nb, Ta, Cr, Mo and W) of the periodic table, or solid solutions of these.

Among them, in the case of a substrate comprising a sintered body of a hard phase mainly composed of tungsten carbide and inevitable impurities, since no VIII group metal in the periodic table exists on the surface of the sintered body, transformation of diamond to graphite will occur very little during deposition of diamond and this substrate is preferable to give an excellent film of diamond.

In the substrate of a sintered body comprising a hard phase mainly composed of tungsten carbide and inevitable impurities, when the hard phase consists only of tungsten carbide or the case when it contains at least 50% by volume of tungsten carbide and other at least one component of carbides or carbonitrides of the group 4a, 5a and 6a metals of the periodic table and solid solutions of these. Among them, particularly the case when the hard phase consists of 90% by volume or more of tungsten carbide, for example, the case consisting only of tungsten carbide comprising WC or WC-$W_2C$, or the case consisting of WC-$Mo_2C$, WC-$W_2C$-$Mo_2C$ or WC-(W,Mo)C comprising 90% by volume or more of these tungsten carbides and the balance of molybdenum carbide is preferable, because adhesion strength between the film and the substrate is excellent, and also the strength of the substrate is excellent.

Particularly, when the substrate comprises a sintered body composed of a hard phase of WC and inevitable impurities, if decarburization treatment mentioned below is carried out, and subsequently, diamond and/or diamond like carbon is deposited on the surface of said substrate, the surface portion of the substrate is transformed to a surface layer of recrystallized tungsten carbide as mentioned below, and consequently, diamond coated sintered body excellent in adhesion strength is obtained. Also, when the substrate comprises a sintered body composed of a hard phase mainly composed of WC and $W_2C$ mixedly present and inevitable impurities, particularly in case of the hard phase composed of 75% by weight or less of $W_2C$ and the balance of WC, the surface layer of WC is transformed to that of recrystallized WC without effecting the decarburizing treatment into the substrate by depositing a diamond film. Therefore, it is preferred to use the above substrate since a diamond coated sintered body is excellent in adhesion strength between the substrate and the film when the diamond is deposited on the surface of the above surface layer.

The substrate in the diamond-coated sintered body of the present invention contains inevitable impurities in addition to the hard phase as described above, and as such inevitable impurities, there are impurities primarily contained in the starting materials, and the impurities entrained during the mixing and milling process of the starting materials. As the latter inevitable impurities, there may be included, for example, Co, Ni, Fe, W, Cr, Mo, etc. entrained from the mixing vessel or ball, etc., and even when these inevitable impurities may be contained in an amount of 0.5% by volume in the substrate, lowering in adhesion strength between the substrate and the film is small, and also, there is the effect of reinforcing the strength of the substrate. Therefore, such case is also practically applicable. These substrates are preferred to have a constitution in which an average grain size of the tungsten carbide existing in the surface layer to at most 10 $\mu$m from the surface toward the inner portion is finer as compared with the average grain size of the tungsten carbide existing internally of the substrate except for the surface layer, because adhesion strength between the substrate and the film is more excellent, and also the quality of the diamond film can be enhanced.

The case when the grain size of the tungsten carbide in the surface layer is 1.0 $\mu$m or less, preferably 0.5 $\mu$m or less, the adhesion strength between the substrate and the film tends to be further excellent.

On the other hand, in the case when the substrate is a sintered body comprising 4% by weight or less of a binding phase composed mainly of Co and/or Ni and the balance comprising a hard phase composed mainly of tungsten carbide and inevitable impurities, the strength of the substrate itself is high, and yet the Co and/or Ni existing on the substrate surface is little in amount, and such Co and/or Ni can be easily removed, whereby the surface layer can be generated easily. The binding phase composed mainly of Co and/or Ni as herein mentioned shows the case when it consists only of Co and/or Ni, or the case when Fe, W, Cr, V, Zr, Cu and Mo exist in a minute amount as a solid solution in Co and/or Ni, while the hard phase composed mainly of tungsten carbide refers to the case when it consists only of tungsten carbide, or when it consists of a mixture of tungsten carbide and a cubic compound which inhibits the grain growth of tungsten carbide primarily, such as titanium carbide, tantalum carbide, niobium carbide, tungsten-titanium carbide, tungsten-tantalum-titanium carbide, tungsten-tantalum-niobium-titanium carbide, etc.

The surface layer in the diamond-coated sintered body excellent in adhesion strength of the present invention can be controlled in the depth of it to about 50 $\mu$m toward the inner portion from the surface of the substrate, but because the treatment time for preparation of the surface layer is prolonged and the surface layer is provided for enhancing adhesion strength of the film, it should be preferably made as thin as possible. The depth of the surface layer, which may differ depending on the use and the purpose, may be controlled to a thickness of, for example, 0.1 to 10 $\mu$m, preferably 0.5 to 5 $\mu$m. As for the average grain size of the recrystallized tungsten carbide in the surface layer, it is finer than the average grain size of the tungsten carbide contained in the sintered body excluding the surface layer. For example, if the average grain size contained in the sintered body is 10 $\mu$m in an extreme case, the average grain size of the recrystallized tungsten carbide in the surface layer may be less than 10 $\mu$m, but for adhesion strength between the surface layer and the diamond film, the grain size of the recrystallized tungsten carbide should be desirably made such as 0.3 $\mu$m or less.

As to the composition of the recrystallized tungsten carbide constituting the surface layer, in some cases, the whole surface consists of a layer of recrystallized WC, or in other cases, depending on the thickness and the treatment conditions of the surface layer, the surface layer portion adjacent to the film is a layer of recrystallized WC and the surface layer at the further inner side of the substrate is a layer of recrystallized $W_2C$ layer or a layer comprising a mixture of recrystallized $W_2C$ and recrystallized WC, but it is preferred that the whole surface should consist of a layer consisting of recrystallized WC.

The recrystallized tungsten carbide as mentioned here refers to one which is once converted from tungsten carbide to tungsten, and again crystallized out as tungsten carbide.

The film of diamond and/or diamond-like carbon in the diamond-coated sintered body excellent in adhesion strength of the present invention may be one exhibiting properties of diamond or properties approximate to diamond such as electrical resistance, light transmittance, hardness, etc., specifically exhibiting a peak at 1333 $cm^{-1}$ which has been said to be the Raman line of diamond when subjected to Raman spectroscopic analysis. To describe in more detail, such film includes the case when it consists only of diamond, the case when it contains diamond and other amorphous carbon or glassy carbon, etc., or the case when it consists of diamond-like carbon which has been said to exhibit the properties approximate to diamond although containing no diamond. Particularly, there is also the case when the film side adjacent to the surface layer comprises diamond-like carbon and the film side apart from the surface layer is consisted of diamond. The thickness of the film, which may differ depending on the use and the shape, is preferably made thicker, for example, 5 to 15 $\mu$m, for uses when abrasion resistance rather than impact resistance is emphasized, or thinner, for example, 0.1 to 5 $\mu$m, preferably 0.5 to 2 $\mu$m, for uses when impact resistance is emphasized such as milling cutter, and uses having sharp cutting blade such as drill or slitter.

The half-value width in the diamond-coated sintered body of the present invention is obtained by measuring the X-ray diffraction line at the WC (100) face with the Cr-K$\alpha$ line from the surface of the film by means of a diffractometer with chromium target, a monochrometer of graphite single crystal, and determining the width of the diffraction line at the portion of ½ height of the diffraction peak at the WC (100) face from the background of the diffraction line. If the half-value width determined thus comes out of 0.2° to 0.4° adhesion strength of the film to the substrate is lowered. Although what this half-value means is not clear, it may be considered to be fluctuated depending on the amount of the residual strain in the surface layer of the substrate and the WC grain size in the surface layer of the substrate. The value of this half-value width is applied to only when the substrate comprises a sintered body composed of a hard phase and inevitable impurities.

The substrate in the process for forming the diamond-coated sintered body of the present invention can be made a dense sintered body by mixing and milling the starting materials composed mainly of tungsten carbide and then subjecting to hot press sintering or hot isostatic pressing treatment (HIP treatment) after normal sintering.

When a metal such as Co exists in the surface layer of the substrate, carbon existed in the tungsten carbide in the surface layer of the substrate, oxygen in the decarburization treatment gas and Co in the surface layer of the substrate become a cobalt carbonyl, which is evaporated Co from the surface layer of the substrate, and also the tungsten carbide (WC) in the surface layer of the substrate becomes tungsten, $W_2C$ or may be tungsten carbonyl by the decarburization treatment, and subsequently they are crystallized again as tungsten carbide by the diamond coating treatment, thereby forming a surface layer.

The process for preparing the diamond-coated sintered body excellent in adhesion strength of the present invention comprises setting a substrate of a sintered body composed mainly of tungsten carbide in a reaction vessel, decarburizing the surface layer of said substrate by elevating the temperature within said reaction vessel in a decarburizable atmosphere, and then performing a diamond film treatment, thereby converting the surface layer of said substrate to a surface layer comprising recrystallized tungsten carbide, and also making the average grain size of the recrystallized tungsten carbide in said surface layer finer than that of the tungsten carbide in the inner portion of said substrate.

In the process for preparing the diamond-coated sintered body excellent in adhesion strength of the present invention, a specific example of the decarburizable atmosphere within the reaction vessel is preferably a gaseous mixture of hydrogen gas and oxygen gas, or a gaseous mixture of hydrogen gas and some kinds of organic gases comprising oxygen gas. In the case of a gaseous mixture of hydrogen gas and oxygen gas, it is necessary to take sufficient care, because explosion may occur depending on the mixing ratio, and particularly the case when it is a decarburizable atmosphere consisting of 0.1 to 5% by volume of oxygen and the balance of hydrogen is preferred, because safety is high, a surface layer comprising recrystallized tungsten carbide with finer grain size can be formed after diamond is deposited on the surface of said substrate, and adhesion strength between the surface layer and the film is also excellent. Some kinds of organic gases as herein mentioned may include methane, ethane, propane, butane, methanol, ethanol, propanol, butanol, methyl ether, ethyl ether, etc. When the substrate is heated with such decarburizable atmosphere, the decarburization treatment prefers to be performed by the plasma treatment at a temperature of the substrate of 500° to 1200° C. The plasma treatment at this time can be effected with microwave or high frequency, and diamond coating treatment prefers to be performed subsequently within the same reaction vessel under the plasma treatment state, because there is almost no attachment of impurities between the surface layer and the film.

The reasons why can be increased the adhesion strength between diamond film and the substrate in the present invention is considered as stated below. Namely, this is because graphite generated at an initial stage of the diamond deposition is used for carburization of a surface decarburized layer of the substrate, thereby graphite formed at interface between the surface layer and the film is decreased, and as the result, adhesion strength between the substrate and the film is heightened. Particularly, in case where the substrate comprises a sintered body composed of a hard phase of tungsten carbides mixedly composed of $W_2C$ and WC and inevitable impurities, $W_2C$ at the surface portion of the substrate becomes WC by diamond deposition, which also has the function of promoting formation of nuclei of diamond.

Further, the diamond-coated sintered body excellent in adhesion strength of the present invention, which has a surface layer comprising tungsten carbide of fine grains, has increased amount of grain boundaries of tungsten carbide adjacent to the diamond film, and the diamond grains are embedded in shape of wedge in the grain boundaries of tungsten carbide, whereby adhesion strength between the surface layer and the diamond film are enhanced.

The process for preparing the diamond-coated sintered body excellent in adhesion strength of the present invention can remove a metal such as Co existing in the surface layer of the substrate, by the plasma treatment in a decarburizable atmosphere, particularly a gaseous mixture containing oxygen gas, also has a surface layer comprising recrystallized tungsten carbide of fine grains by the decarburization treatment into the substrate, and subsequently, diamond film is deposited on the surface of this substrate. Further the same treatment as described above performed in the same reaction vessel continuously will make difficult to attach the impurities at the interface between the film and the surface layer, whereby deposition of diamond is enhanced to form a dense and fine film.

EXAMPLE 1

Tungsten carbide powder with an average grain size of 1.0 μm as starting material was ball-milled with balls made of cemented carbide in wet system, and a WC sintered body with an average grain size of 0.8 μm (containing about 0.5% by weight of a binding phase composed mainly of Co and/or Ni as inevitable impurities) was obtained by hot pressing process. The surface state of the substrate was as-sintered state prepared by re-sintering treatment and ground state by a grinding wheel, and subsequently, performed the decarburization treatment as shown below (A) and the diamond coating treatment (B), so that the products of the present invention 1 and 2 as shown in Table 1 were obtained.

As comparison, the same substrate above-mentioned was performed directly with the treatment (B) without the treatment (A) to give compare products 1 and 2 as shown in Table 1.

| (A) The decarburization treatment: | |
|---|---|
| Gas composition | 99% by volume $H_2$ - 1% by volume $O_2$ |
| Gas pressure | 60 Torr |
| Substrate temperature | 950° C. |
| Microwave output | 0.8 kw |
| Treatment time | 30 min. |
| (B) Diamond coating treatment: | |
| Gas composition | 98% by volume $H_2$ - 2% by volume $CH_4$ |
| Gas pressure | 90 Torr |
| Substrate temperature | 1050° C. |
| Microwave output | 1.0 kw |
| Treatment time | 120 min. |

By use of the products of the present invention 1, 2 and compare products 1, 2, turning tests were carried out under the conditions shown below, and the results shown in Table 1 were obtained.

| Turning test conditions: | |
|---|---|
| Workpiece | Al - 20% Si alloy |
| Chip shape | SPGN 120308 |
| Cutting speed | 200 m/min. |
| Feed rate | 0.1 mm/rev |
| Depth of cut | 0.5 mm |
| Cutting time | 10 min. |
| Evaluation | average amount of wear in flank face ($V_B$mm) |

TABLE 1

| Sample No. | Substrate surface before treatment | Surface layer Grain size | Surface layer Thickness | Diamond film thickness | Results of cutting tests $V_B$ (mm) | Results of cutting tests Damage situation |
|---|---|---|---|---|---|---|
| Present product 1 | Ground surface | 0.3 μm | 1.5 μm | 5 μm | 0.02 | Normal abrasion |
| Present product 2 | As-sintered surface | 0.3 μm | 1.5 μm | 5 μm | 0.02 | Normal abrasion |
| Compare product 1 | Ground surface | | | 5 μm | 0.38 | Flake off film |
| Compare product 2 | As-sintered surface | | | 5 μm | 0.40 | Flake off film |

EXAMPLE 2

By use of WC powder with an average grain size of 1.0 μm (written as "a-WC"), WC powder with an average grain size of 3.0 μm (written as "b-WC"), WC powder with an average grain size of 5.0 μm (written as "c-WC") and Co powder, VC powder with an average grain size of 1 to 2 μm, they were formulated to a WC-0.5 wt. % VC-2 wt. % Co composition, mixed by ball milling, dried, press molded and sintered similarly as in Example 1 to give the respective substrates shown in Table 2. After the surface of the substrate was ground, it was performed the decarburization treatment of (A) (provided that the treatment time is 60 min) and the diamond depositing treatment of (B) (provided that the treatment time is 20 min) in Example 1 to give the products of the present invention 3, 4 and 5 shown in Table 2.

As comparison, by use of the same substrate above-mentioned, only the treatment (B) in Example 1 was performed to give Compare products 3, 4 and 5. By use of the products of the present invention 3, 4, 5 and the Control products 3, 4, 5, milling tests were carried out to obtain the results shown in Table 2.

| Milling cutting test conditions: | |
|---|---|
| Workpiece | hard carbon |
| Chip shape | SPGN 120308 |
| Cutting speed | 300 mm/min. |
| Feed rate | 0.1 mm/tooth |
| Depth of cut | 0.5 mm |
| Cutting time | 90 min. |
| Evaluation | Average amount of wear in flank wear ($V_B$mm) |

TABLE 2

| Sample No. | Kind of starting material WC | Average grain size of WC internally of substrate | Surface layer Grain size | Surface layer Thickness | Diamond coating thickness | Milling cutting test results $V_B$ (mm) | Damage situation |
| --- | --- | --- | --- | --- | --- | --- | --- |
| This invention |  |  |  |  |  |  |  |
| 3 | a-WC | 0.8 μm | 0.3 μm | 1 μm | 2 μm | 0.09 | Normal abrasion |
| 4 | b-WC | 2.5 μm | 0.3 μm | 1 μm | 2 μm | 0.11 | Normal abrasion |
| 5 | c-WC | 4 μm | 0.3 μm | 1 μm | 2 μm | 0.10 | Normal abrasion |
| Compare product |  |  |  |  |  |  |  |
| 3 | a-WC | 0.8 μm | — | — | 2 μm | 0.35 | Coating flake-off, chipping |
| 4 | b-WC | 2.5 μm | — | — | 2 μm | 0.39 | Coating flake-off, chipping |
| 5 | c-WC | 4 μm | — | — | 2 μm | 0.37 | Coating flake-off, chipping |

As contrasted to the fact that the diamond-coated sintered body of the prior art comprising an intermediate layer consisted of WC or $W_2C$ interposed between the substrate of a cemented carbide and a diamond film according to the CVD method or the PVD method could not be practically applied, because the adhesion strength of film was inferior and the cutting performance was substantially equal to the case when a film was directly formed on the substrate, the diamond-coated sintered body excellent in adhesion strength of the present invention has the tool life of being improved by 4 to 20-fold in the life test including abrasion resistance and chipping resistance in the cutting test as compared with Compare product in which diamond film is formed directly on the substrate.

Also, the process for preparing the diamond-coated sintered body excellent in adhesion strength of the present invention can perform the decarburizing treatment of the substrate and the diamond coating treatment continuously in the same reaction vessel, and therefore, the influence of the impurities is very little, whereby there is the effect that the adhesion strength between the surface layer and the film can be remarkably enhanced.

EXAMPLE 3

WC, $MO_2C$ with an average grain size of 3.0 μm were mixed and ball-milled with balls made of a cemented carbide in wet system and dried, and subsequently sintered by hot press method in vacuum to give a substrate of a sintered body composed mainly of WC. The surface state of the substrate is made as-sintered state or the ground state as shown in Table 3, and then subjected to the decarburization treatment under the conditions (C) shown below, and subsequently, under the diamond coating conditions (D) shown below in the same reaction vessel to give the products of the present invention 6, 7 and 9. Also, the diamond film was deposited on the surface of the substrate under the conditions (D) shown below without the decarburization treatment under the conditions (C) shown below to give the product of the present invention 8.

| (C) The decarburization treatment conditions: | |
| --- | --- |
| Gas composition | 98% by volume $H_2$ - 2% by volume $O_2$ |
| Gas pressure | 60 Torr |
| Substrate temperature | 930° C. |
| Microwave output | 0.7 kw |
| Treatment time | 30 min. |

| -continued | |
| --- | --- |
| (D) Diamond coating treatment conditions: | |
| Gas composition | 98% by volume $H_2$ - 2% by volume $CH_4$ |
| Gas pressure | 80 Torr |
| Substrate temperature | 1060° C. |
| Microwave output | 1.0 kw |
| Treatment time | 120 min. |

As Compare product, the above treatment (D) was performed on the surface of a commercially available silicon nitride type ceramics to give Compare product 6. Also, a commercially available substrate of cemented carbide being set in another reaction vessel subjected to the CVD treatment in a $WF_6$-$CH_4$-$H_2$ mixture gases to have $W_2C$ film, which thickness of it is about 1.5 μm, and subsequently, diamond film is deposited by application of the above treatment (D) to give Control product 7. Further, the above treatment (D) was performed on the surface of a commercially available W plate as the substrate, to give Comparative produce 8.

The products of the present invention 6, 7, 8 and 9, and Compare products 6, 7 and 8 were examined for the thickness of diamond film to obtain the results shown in Table 3. Also, the samples of the present products 6, 7 and 9 subjected to the treatment (C) were also examined for surface layer by X-ray diffraction and SEM to obtain the results shown together in Table 3.

By use of these products of the present invention 6, 7, 8 and 9, and Compare products 6, 7 and 8, the turning test and milling test were carried out under the conditions (E) and (F) shown below, and the average amount of wear in flank wear and the damage situation were observed to obtain the results shown in Table 4.

| (E) Turning test conditions: | |
| --- | --- |
| Workpiece | Al - 18% Si alloy |
| Chip shape | SPGN 120308 |
| Cutting speed | 226 m/min. |
| Feed rate | 0.1 mm/teeth |
| Depth of cut | 0.5 mm |
| Cutting time | 20 min. |
| Evaluation | average relief face abraded amount ($V_Bmm$) |
| (F) Milling test conditions: | |
| Workpiece | Hard carbon |
| Tip shape | SNCN 43ZFN |
| Cutting speed | 356 m/min. |
| Feed rate | 0.06 mm/teeth |
| Depth of cut | 0.5 mm |

TABLE 3

| Sample No. | Substrate Composition | Substrate Surface state | Surface layer Grain size of WC | Surface layer Thickness (μm) | Thickness of diamond-film (μm) |
|---|---|---|---|---|---|
| Present product 6 | WC sintered body | As-sintered state | 0.2 μm | 4.5 | 4.8 |
| Present product 7 | WC sintered body | Ground state | 0.2 μm | 4.2 | 4.7 |
| Present product 8 | WC sintered body | As-sintered state | — | — | 4.8 |
| Present product 9 | WC-5 vol % Mo$_2$C | Ground state | 0.2 μm | 4.3 | 4.7 |
| Compare product 6 | Si$_3$N$_4$ ceramics | Ground state | — | — | 4.9 |
| Compare product 7 | Cemented carbide | W$_2$C coated | — | — | 4.8 |
| Compare product 8 | W substrate | Ground state | — | — | 4.8 |

-continued

| Cutting time | 60 min. |
|---|---|

TABLE 4

| Sample No. | (E) Cutting test results V$_B$ (mm) | (E) Damage situation | (F) Cutting test results V$_B$ (mm) | (F) Damage situation |
|---|---|---|---|---|
| Present product 6 | 0.08 | Normal abrasion | 0.12 | Normal abrasion |
| Present product 7 | 0.12 | Normal abrasion | 0.15 | Normal abrasion |
| Present product 8 | 0.18 | Normal abrasion (Tendency to be finely flaked-off) | 0.23 | Normal abrasion (Tendency to be finely flaked-off) |
| Present product 9 | 0.13 | Normal abrasion | 0.17 | Normal abrasion |
| Compare product 6 | 0.45 | Flaked off and chipping | 0.98 | Blade edge defected after 10 min. |
| Compare product 7 | 0.22 | Normal abrasion but finely flaked off | 0.32 | Flaked off |
| Compare product 8 | 0.28 | Plastic deformation at blade edge | 0.52 | Flaked off after 35 minutes |

From the results as described above, the diamond-coated sintered body of the present invention is excellent in adhesion strength between the film and the substrate as compared with the diamond-coated sintered body of the prior art comprising a diamond film formed on each of a silicon nitride type ceramics substrate, a substrate of a cemented carbide having a layer of W$_2$C or W substrate, and when used the diamond coated sintered body of the present invention as the material for cutting tools, the adhesion strength between the film and the substrate is remarkably excellent, so that the tool life of this prolongs by about 20% to 8-fold as compared with that of the prior art as described above.

Also, the process for preparing the diamond-coated sintered body excellent in adhesion of the present invention can make a surface layer constructed of fine grain composing mainly of tungsten carbide on the surface of this substrate, whereby there is the effect that adhesion strength between the surface layer and the film can be made more excellent.

EXAMPLE 4

By use of WC powder, Mo$_2$C powder as the starting materials, they were mixed and milled with balls made of a cemented carbide in wet system, and hot press sintered in vacuum to obtain a sintered body composed mainly of WC with an average grain size of 3.0 μm. After the surface of the substrate was made as-sintered state or ground state as shown in Table 5, it was subjected to the decarburization treatment under the conditions as described above (C), followed subsequently by the diamond deposition treatment under the conditions as described above (D) to give the respective samples shown in Table 5. (only the product of the present invention 11 has 95 vol. % WC—5 vol.Mo$_2$C as the composition of substrate, and others have 100% WC composition)

Next, the states of the surface layer of the substrate, and the thickness of the diamond film of the respective samples were examined by an optical microscope and a scanning electron microscope to obtain the results shown in Table 5. Also, through the surface of the diamond film, X-ray diffraction was carried out with Cr-Kα line under the conditions (G) shown below to determine the half-value width of the X-ray diffraction line at the WC (100) face, and the results are shown in Table 6.

| (G) X-ray diffraction conditions: | |
|---|---|
| Target | Cr |
| Tube voltage | 45 kv |
| Tube current | 30 mA |
| Scale range | 400 cps |
| Time constant | 1 sec. |
| Scanning speed | 1/4°/min. |
| Chart speed | 10 mm/min. |
| Scattering slit | 1° |
| Light receiving slit (RS) | 0.3° |
| R.S.M. | 0.8° (monochrometer side) |
| S.S | 1° |
| Scanning range | 55° to 60° |

Further, by use of the respective samples shown in Table 5, cutting tests were carried out under the conditions (H) shown below, and the average amount of wear in flank wear (V$_B$) and the damaged state at that time were examined to obtain the results shown in Table 6.

| (H) Turning test conditions: | |
|---|---|
| Workpiece | Hard carbon |
| Shape | SPGN 120308 |
| Cutting speed | 50 m/min. |
| Feed rate | 0.1 mm/rev |
| Depth of cut | 1 mm |

-continued

| (H) Turning test conditions: | |
| --- | --- |
| Cutting time | 60 min. |

TABLE 5

| Sample No. | Substrate Surface state | Substrate Kind of grinding wheel | Surface layer Grain size of WC (μm) | Surface layer Thickness (μm) | Thickness of diamond-film (μm) |
| --- | --- | --- | --- | --- | --- |
| Present product 10 | As-sintered state | — | 0.21 | 4.2 | 4.8 |
| Present product 11 | As-sintered state | — | 0.18 | 4.2 | 4.7 |
| Present product 12 | Ground state | #230 Resinoid bond | 0.20 | 4.0 | 4.8 |
| Present product 13 | Ground state | #230 Resinoid bond | — | — | 4.8 |
| Present product 14 | Ground state | #1000 Resinoid bond | — | — | 4.9 |
| Present product 15 | Ground state | #140 Resinoid bond | — | — | 4.7 |
| Present product 16 | Electrolytically ground state | — | 0.23 | 4.3 | 4.8 |
| Compare product 9 | Lap state | — | — | — | 4.7 |
| Compare product 10 | Ground state | #120 Metal bond | — | — | 4.7 |

TABLE 6

| Sample No. | Half-value width at WC (100) face (°) | Cutting test results $V_B$ (mm) | Cutting test results Damage situation |
| --- | --- | --- | --- |
| Present product 10 | 0.28 | 0.09 | Normal abrasion |
| Present product 11 | 0.30 | 0.08 | Normal abrasion |
| Present product 12 | 0.28 | 0.10 | Normal abrasion |
| Present product 13 | 0.33 | 0.13 | Normal abrasion (Tendency to be finely flaked off) |
| Present product 14 | 0.22 | 0.21 | Slightly flaked off but normal abrasion |
| Present product 15 | 0.28 | 0.19 | Slightly flaked off but normal abrasion |
| Present product 16 | 0.26 | 0.08 | Normal abrasion |
| Compare product 9 | 0.18 | 0.54 | Flaked off after 5 minutes |
| Compare product 10 | 0.44 | 0.36 | Flaked off |

As can be seen from the above results, the diamond-coated sintered body of the present invention is excellent in adhesion strength of the film to the substrate as compared with the diamond-coated sintered body which is out of the scope of the present invention, and consequently, it has the effect being excellent by about 2.7 to 6.8-fold in abrasion resistance as compared with other ones.

Also, the process for preparing the diamond-coated sintered body excellent in adhesion strength of the present invention is not substantially influenced by the amount of the strain of the surface layer before diamond coating, further, it can give a substrate having a surface layer comprising tungsten carbide of fine grains after deposition of diamond film, and consequently the diamond coated sintered body of the present invention has the effect of enhancing further adhesion strength of the film to the substrate.

EXAMPLE 5

By using WC powder having an average grain size of 4.0 μm and W powder having an average grain size of 0.5 μm, these powders were mixed and milled by balls of cemented carbide with a predetermined amount of these powders, and after drying, this mixed powder was vacuum sintered by hot press to obtain sintered bodies of the present products 17, 18, 20, 21 and 23 shown in Table 7. Also, by using WC powder having an average grain size of 4.0 μm and $W_2C$ powder having an average grain size of 1.5 μm, these powders were treated in the same process as mentioned above to obtain sintered bodies of the present products 19 and 22 shown in Table 7. By using these sintered bodies, after subjecting to the diamond film treatment shown in the following conditions (I), cutting test was carried out under the same conditions employed in Example 1 (provided that the cutting time is 20 minutes). The results are also shown in Table 7.

| (I) Diamond coating treatment conditions: | |
| --- | --- |
| Gas composition | 97% by volume $H_2$ - 3% by volume $CH_4$ |
| Gas pressure | 50 Torr |
| Gas flow amount | 200 ml/min |
| Substrate temperature | 960° C. |
| Treatment time | 120 min. |

TABLE 7

| | $W_2C$ in substrate (wt %) | Surface layer composition | Thickness of diamond coating (μm) | Cutting test results $V_B$ (mm) | Cutting test results Damage situation |
| --- | --- | --- | --- | --- | --- |
| Present product 17 | 5 | WC | 5.3 | 0.054 | Normal abrasion |
| Present product 18 | 10 | WC | 5.0 | 0.051 | Normal abrasion |
| Present product 19 | 10 | WC | 5.2 | 0.048 | Normal abrasion |

TABLE 7-continued

| | $W_2C$ in substrate (wt %) | Surface layer composition | Thickness of diamond coating (μm) | Cutting test results | |
|---|---|---|---|---|---|
| | | | | $V_B$ (mm) | Damage situation |
| Present product 20 | 25 | WC | 5.1 | 0.050 | Normal abrasion |
| Present product 21 | 50 | WC | 5.2 | 0.049 | Normal abrasion |
| Present product 22 | 50 | WC | 5.2 | 0.052 | Normal abrasion |
| Present product 23 | 75 | WC | 5.0 | 0.075 | Normal abrasion |

As seen from the results in Table 7 and Example 1 and Compare products 1 and 2 shown in Table 1, the diamond coated sintered body of the present invention composing of tungsten carbide mixedly existing WC and $W_2C$ as the substrate shows excellent adhesion strength of the film when it is used as a material for cutting tools, and consequently, it is excellent in abrasion resistance as compared with the compare products, too.

We claim:

1. A diamond-coated sintered body having excellent adhesion strength, comprising a film of diamond and/or diamond-like carbon deposited on a surface of a substrate, wherein:
   said substrate comprises a sintered body of a hard-phase composed mainly of tungsten carbide, and
   said surface of said substrate comprises recrystallized tungsten carbide in the surface layer to at most 10 microns toward the inner portion from the surface of said substrate in which the average grain size of the recrystallized tungsten carbide in the surface layer is finer than the average grain size of the tungsten carbide in the inner portion of the substrate excluding the surface layer.

2. A diamond-coated sintered body as claimed in claim 1, wherein said hard phase comprises 50% by volume or more of tungsten carbide.

3. A diamond-coated sintered body as claimed in claim 1, wherein said tungsten carbide comprises 75% by weight or less of $W_2C$ and the balance of WC.

4. A diamond-coated sintered body having excellent adhesion strength, comprising a film of diamond and/or diamond-like carbon deposited on a surface of a substrate, wherein:
   the substrate comprises a sintered body of a hard-phase consisting essentially of tungsten carbide and recrystallized tungsten carbide in the surface layer to at most 10 microns toward the inner portion from the surface of the substrate in which the average grain size of the recrystallized tungsten carbide in the surface layer is finer than the average grain size of the tungsten carbide in the inner portion of the substrate excluding the surface layer, and the diamond coated sintered body has a half value width of X-ray diffraction line at the WC (100) face with the CR-Kα line through the surface of the coated film being 0.2° to 0.4° in terms of 2Θ.

5. A diamond-coated sintered body as claimed in claim 4, wherein the hard phase comprises 50% by volume or more of tungsten carbide.

6. A diamond-coated sintered body as claimed in claim 4, wherein the tungsten carbide comprises 75% by volume or less of $W_2C$ and the balance of WC.

7. A diamond-coated sintered body having excellent adhesion strength comprising a film of diamond and/or diamond-like carbon deposited on a surface of a substrate, wherein the substrate comprises:
   a sintered body having 4% or less by weight of a binding phase consisting essentially of at least one metal selected from the group consisting of Co and Ni and the balance of a hard phase consisting essentially of tungsten carbide, and
   recrystallized tungsten carbide in the surface layer to at most 10 microns toward the inner portion from the surface of the substrate in which the average grain size of recrystallized tungsten carbide in the surface layer is finer than the average grain size of the tungsten carbide in the inner portion of the substrate excluding the surface layer.

8. A diamond-coated sintered body as claimed in claim 7, wherein said hard phase comprises 50% by volume or more of tungsten carbide.

* * * * *